(12) United States Patent
Choi et al.

(10) Patent No.: US 8,373,456 B2
(45) Date of Patent: Feb. 12, 2013

(54) DOMAIN CROSSING CIRCUIT OF A SEMICONDUCTOR MEMORY APPARATUS

(75) Inventors: Hae Rang Choi, Gyeonggi-do (KR); Yong Ju Kim, Gyeonggi-do (KR); Sung Woo Han, Gyeonggi-do (KR); Hee Woong Song, Gyeonggi-do (KR); Ic Su Oh, Gyeonggi-do (KR); Hyung Soo Kim, Gyeonggi-do (KR); Tae Jin Hwang, Gyeonggi-do (KR); Ji Wang Lee, Gyeonggi-do (KR); Jae Min Jang, Gyeonggi-do (KR); Chang Kun Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 157 days.

(21) Appl. No.: 12/486,281

(22) Filed: Jun. 17, 2009

(65) Prior Publication Data

US 2010/0148833 A1 Jun. 17, 2010

(30) Foreign Application Priority Data

Dec. 12, 2008 (KR) .......................... 10-2008-0126447

(51) Int. Cl.
*H03L 7/00* (2006.01)
(52) U.S. Cl. ......... 327/141; 327/161; 327/163; 375/373
(58) Field of Classification Search .............. 327/91–96, 327/334, 337, 554, 141, 144–163; 341/122–125; 331/1/A, 15–17; 375/373–376
See application file for complete search history.

(56) References Cited

U.S. PATENT DOCUMENTS

| 7,336,749 | B2 * | 2/2008 | Garlepp | 375/355 |
|---|---|---|---|---|
| 7,375,560 | B2 | 5/2008 | Lee et al. | |
| 7,508,893 | B1 * | 3/2009 | Gan et al. | 375/355 |
| 2002/0085656 | A1 * | 7/2002 | Lee et al. | 375/355 |
| 2005/0047539 | A1 * | 3/2005 | Oh et al. | 375/355 |
| 2006/0044026 | A1 * | 3/2006 | Lee et al. | 327/141 |
| 2007/0073942 | A1 | 3/2007 | Gregorius et al. | |
| 2007/0248201 | A1 * | 10/2007 | Ker et al. | 375/355 |
| 2008/0063128 | A1 * | 3/2008 | Chatwin | 375/375 |
| 2008/0284475 | A1 * | 11/2008 | Lee | 327/149 |
| 2009/0195281 | A1 * | 8/2009 | Tamura et al. | 327/163 |
| 2009/0302909 | A1 * | 12/2009 | Lee | 327/158 |
| 2010/0134158 | A1 * | 6/2010 | Pignol et al. | 327/156 |

FOREIGN PATENT DOCUMENTS

| KR | 10-0630742 B1 | 9/2006 |
|---|---|---|
| KR | 1020080074669 A | 8/2008 |

* cited by examiner

*Primary Examiner* — Lincoln Donovan
*Assistant Examiner* — Brandon S Cole
(74) *Attorney, Agent, or Firm* — Ladas & Parry LLP

(57) ABSTRACT

The domain crossing circuit of a semiconductor memory apparatus for improving a timing margin includes a sampler that provides a sampling internal signal generated by delaying an internal input signal by a predetermined time in response to a clock and an edge information signal that defines an output timing of the sampling internal signal and an output stage that allows the sampling internal signal to be synchronized with the clock in response to the edge information signal to be output as a final output signal.

21 Claims, 7 Drawing Sheets

DOMAIN CROSSING CIRCUIT OF A SEMICONDUCTOR MEMORY APPARATUS

CROSS-REFERENCES TO RELATED PATENT APPLICATION

The present application claims priority under 35 U.S.C 119(a) to Korean Application No. 10-2008-0126447, filed on Dec. 12, 2008, in the Korean Intellectual Property Office, which is incorporated herein by reference in its entirety as set forth in full.

BACKGROUND

Embodiments described herein relate generally to a semiconductor memory apparatus, and more particularly, to a domain crossing circuit of a semiconductor memory apparatus.

A synchronous semiconductor memory apparatus is a semiconductor apparatus that performs an operation in synchronization with a clock. At this time, command signals and data must be synchronized with an external clock in order to properly operate in internal circuits, and internal signals synchronized with internal clock signals must be synchronized with the external clock. This is referred to as a region switchover between an internal clock region and an external clock region, and is commonly referred to as a domain crossing.

For example, a domain crossing circuit allows the command signals or data, etc. to be synchronized with the internal clock generated using a delay-locked loop (DLL) in order to provide synchronized signal to the clock required in the internal circuit unit. However, according to physical positions of control pins (RAS, CAS, WE, CS, etc.) used with command signals, a difference may exist between the time when command signals are applied from an external system and the time when signals are actually received by the control pins. Therefore, when the signals applied to the control pins, etc. are delayed by a predetermined time to be synchronized with the internal clock, in consideration of such physical positions, it is difficult to synchronize nonsynchronization signals in a high-frequency clock accurately. As such, a timing margin of the signals may be insufficient.

SUMMARY

A domain crossing circuit of a semiconductor memory apparatus for improving a timing margin is disclosed herein.

In one aspect, a domain crossing circuit includes a sampler that provides a sampling internal signal generated by delaying an internal input signal by a predetermined time in response to a clock and an edge information signal that defines an output timing of the sampling internal signal; and an output stage that allows the sampling internal signal to be synchronized with the clock in response to the edge information signal to be output as a final output signal.

In another aspect, a domain crossing circuit includes a sampler that provides a sampling internal signal generated by allowing an internal input signal that is a nonsynchronous signal to be synchronized with a clock and an edge information signal that becomes an output reference of the sampling internal signal; and a final output signal synchronized with the clock by delaying the sampling internal signal at a different delay time according to levels of the edge information signal, wherein the sampling internal signal is selectively synchronized with a rising edge or a falling edge of the clock and the final output signal is synchronized with the rising edge of the clock.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Hereinafter, a semiconductor integrated circuit according to an embodiment of the present invention will be described with reference to the accompanying drawings.

According to an embodiment of the present invention, a domain crossing circuit capable of accurately synchronizing an internal input signal for a high frequency clock is provided. Furthermore, even when a set up margin between an internal input signal and a clock is insufficient, according to an embodiment of the present invention, the domain crossing circuit controls the internal input signals to be output at a constant timing by being synchronized with an edge of the clock. Thereby, according to an embodiment of the present invention, a domain crossing circuit suitable for reliable operation of a high-speed circuit is realized.

Figure 1:
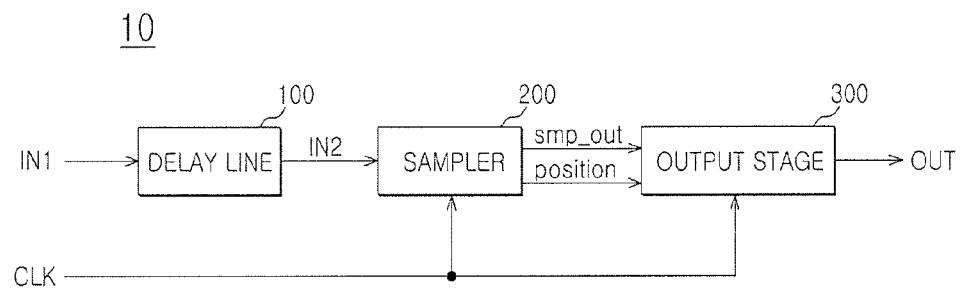
FIG. 1 is a schematic block diagram showing a domain crossing circuit of a semiconductor memory apparatus according to an embodiment of the present invention.

FIG. 1 is a schematic block diagram of a domain crossing circuit 10 according to an embodiment of the present invention. Referring to FIG. 1, the domain crossing circuit 10 is configured to include a delay line 100, a sampler 200, and an output stage 300.

The delay line 100 delays an external input signal IN1 by a predetermined time, in consideration of a transfer time from an external pin (not shown) to an internal circuit unit (not shown), so as to provide an internal input signal IN2. The delay line 100 may be implemented using various methods. For example, a plurality of inverter chains coupled in series, a NAND gate logic, etc., may be used to realize the delay line 100. The delay line 100 is constituted by a nonsynchronization delay device so that there may be a difference between time when the internal input signal IN2 is output from the external input signal IN1 and a predetermined delay time. The external input signal IN1 may be input data, however it is to be understood that the present invention is not limited in this regard, and the external input signal may also be, for example, a command signal, etc.

According to an embodiment, the sampler 200 provides the internal input signal IN2 as a sampling internal signal smp_out in synchronization with a clock CLK. Further, the sampler 200 provides an edge information signal position for determining whether the sampling internal signal smp_out is output in response to a rising edge of the clock CLK or is output in response to a falling edge of the clock CLK. That is, the sampler 200 provides the sampling internal signal smp_out by synchronizing the internal input signal IN2, which is a nonsynchronous signal, with one of the rising edge and the falling edge of the clock CLK.

More specifically, the sampler 200 samples the internal input signal IN2 using one of the rising edge and the falling edge of the clock CLK, and primarily synchronizes the internal input signal IN2 with the clock CLK using the sampled information. At this time, the sampling internal signal smp_out may be output based on the rising edge or the falling edge of the clock CLK based on when the internal signal IN2 is delayed. Therefore, in an embodiment of the present invention, edge information of the clock at the time when the sampling internal signal smp_out is output is also required in a subsequent operation, thereby providing the edge information signal position.

The output stage 300 synchronizes the sampling internal signal smp_out with a desired edge of the clock CLK in response to the edge information signal position to provide the sampling internal signal smp_out as a final output signal OUT. According to an embodiment of the present invention, the output stage 300 synchronizes the sampling internal signal smp_out, primarily synchronized with the clock CLK, with the rising edge of the clock CLK.

In this case, the edge of the clock CLK that becomes the reference of output according to the feature of the circuit units may use the rising edge or the falling edge, however the final output signal OUT is provided based on the rising edge of the clock CLK, as will be described in detail below.

Figure 2:
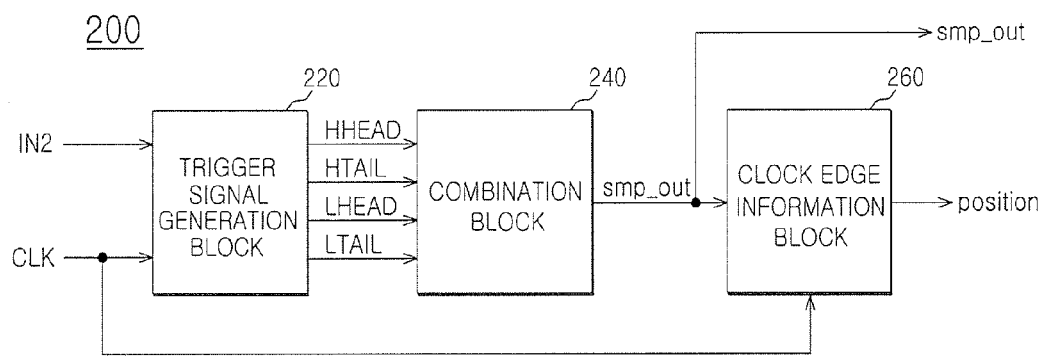
FIG. 2 is a schematic block diagram showing a sampler of the domain crossing circuit shown in FIG. 1.
Figure 3:
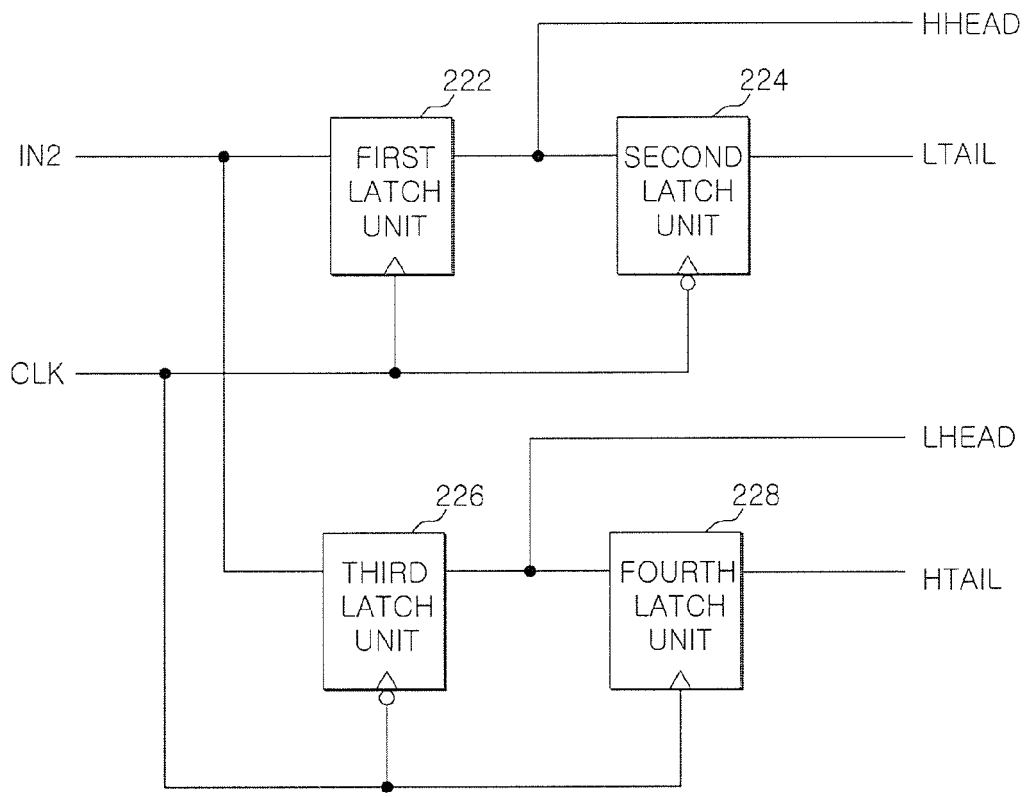
FIG. 3 is a schematic circuit diagram showing a trigger signal generation block of the sampler shown in FIG. 2.
Figure 4:
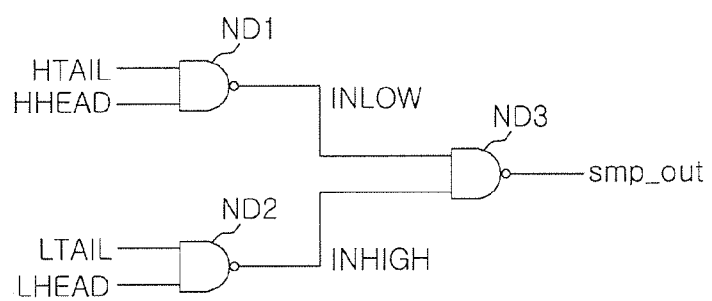
FIG. 4 is a schematic circuit diagram showing a combination block of the sampler shown in FIG. 2.

FIG. 2 is a block diagram of shown an embodiment of the sampler 200 shown in FIG. 1. FIGS. 3 and 4 are circuit diagrams showing embodiments of the trigger signal generation block 220 and the combination block 240 shown in FIG. 2, respectively.

Referring to FIGS. 2 to 4, the sampler 200 is configured to include a trigger signal generation block 220, a combination block 240, and a clock edge information block 260.

The trigger signal generation block 220 generates first to fourth trigger signals HHEAD, LTAIL, LHEAD, and HTAIL in response to the internal input signal IN2 and the clock CLK.

The trigger signal generation block 220 is configured to include first to fourth latch units 222, 224, 226, and 228.

The first latch unit 222 latches the internal input signal IN2 on the rising edge of the clock CLK so as to provide the internal input signal as the first trigger signal HHEAD. The first latch unit 222 samples a logic level of the internal input signal IN2 based on the rising edge of the clock CLK and delays the internal input signal IN2 by a predetermined time to output the first trigger signal HHEAD. In other words, the first latch unit 222 may be a delay element that responds to the rising edge of the clock CLK.

The second latch unit 224 latches the first trigger signal HHEAD on the falling edge of the clock CLK so as to provide the first trigger signal HHEAD as the second trigger signal LTAIL. The second latch unit 224 delays the internal input signal IN2 by a predetermined time so as to output the internal signal IN2 in a next falling edge of the clock CLK. It will be assumed that a predetermined delay time, for example, a delay time satisfied by 1UI (Unit Interval; ½tCK), is set between the first latch unit 222 and the second latch unit 224.

The third latch unit 226 latches the internal input signal IN2 on the falling edge of the clock CLK so as to provide the internal input signal IN2 as the third trigger signal LHEAD. The third latch unit 226 samples a logic level of the internal input signal IN2 based on the falling edge of the clock CLK. The third latch unit 226 may be considered as a delay element that delays the internal input signal IN2 by a predetermined time in response to the falling edge of the clock CLK.

The fourth latch unit 228 latches the third trigger signal LHEAD on the rising edge of the clock CLK so as to provide the third trigger signal LHEAD as the fourth trigger signal HTAIL. The fourth latch unit 228 delays the third trigger signal LHEAD by a predetermined time in response to the rising edge of the clock CLK so as to provide the fourth trigger signal HTAIL. In the same manner, it will be assumed that a predetermined delay time, for example, a delay time satisfied by 1UI (½tCK), is set between the third latch unit 226 and the fourth latch unit 228.

Both the first and third latch units 222 and 226 sample the internal input signal IN2, but the first and third latch units 222 and 226 sample the internal input signal IN2 using different edges of the clock CLK, i.e., the rising edge and the falling edge of the clock signal CLK. Further, the second and fourth latch units 224 and 228 latch the output of the first and third latch units 222 and 226 respectively to delay the outputs of the respective latch units by a half cycle (½tCK) of the clock CLK. If the cycle of the clock CLK is constant and the delay time between the latch units is also constant, the following equation can be exemplified.

$$\text{(Falling time of clock } CLK\text{–rising time of clock } CLK\text{)}$$
$$\text{within the same clock } CLK \text{ cycle=delay time}$$
$$\text{between latch units coupled in series=}\tfrac{1}{2}tCK \qquad \text{[Equation 1]}$$

Therefore, when explained based on only the clock CLK, regardless of the internal input signal IN2, the second latch 224 and the third latch unit 226 respond to the same timing (i.e., the same falling edge) of the clock CLK. Therefore, if the clock CLK is constant, the transition time of the second trigger signal LTAIL and the third trigger signal LHEAD will correspond to each other, and furthermore if the internal input signal IN2 is received in order to satisfy the set-up time, the second trigger signal LTAIL and the third trigger signal LHEAD that are latched from the same falling edge of the clock CLK will have the same level. It can be appreciated that if the clock CLK has a constant cycle, but the second trigger signal LTAIL and the third trigger signal LHEAD have different levels, the set-up time of the internal input signal IN2 is not satisfied.

The combination block 240 provides the sampling internal signal smp_out continuously, the output timing of the sampling internal signal smp_out is adjusted in response to the first to fourth trigger signals HHEAD, LTAIL, LHEAD, and HTAIL. According to an embodiment of the present invention, even when a set-up margin of the internal input signal IN2 is insufficient, the combination block 240 always provides the sampling internal signal smp_out having a delay time within ½tCK from a time point when the internal input signal IN2 is applied using the first to fourth trigger signals HHEAD, LTAIL, LHEAD, and HTAIL.

As shown in FIG. 4, the combination block 240 is configured to include first to third NAND gates ND1 to ND3.

The first NAND gate ND1 logically NAND combines the first and fourth trigger signals HHEAD and HTAIL to provide a first reference edge signal INLOW.

The second NAND gate ND2 logically NAND combines the second and third trigger signals LTAIL and LHEAD to provide a second reference edge signal INHIGH.

The third NAND gate ND3 logically NAND combines the first and second edge signals INLOW and INHIGH to provide the sampling internal signal smp_out.

The first and fourth trigger signals HHEAD and HTAIL include 'sampling information' sampled from the first rising edge and the second rising edge within 1tCK, and the second and third trigger signals LTAIL and LHED include 'sampling information' sampled from the falling edge shared within 1tCK as described above. The information described above is information that is sampled for controlling the timing margin with the clock CLK at the time point when the internal input signal IN2 is applied. The detailed description thereof will be described in more detail with reference to a timing diagram.

Figure 5:
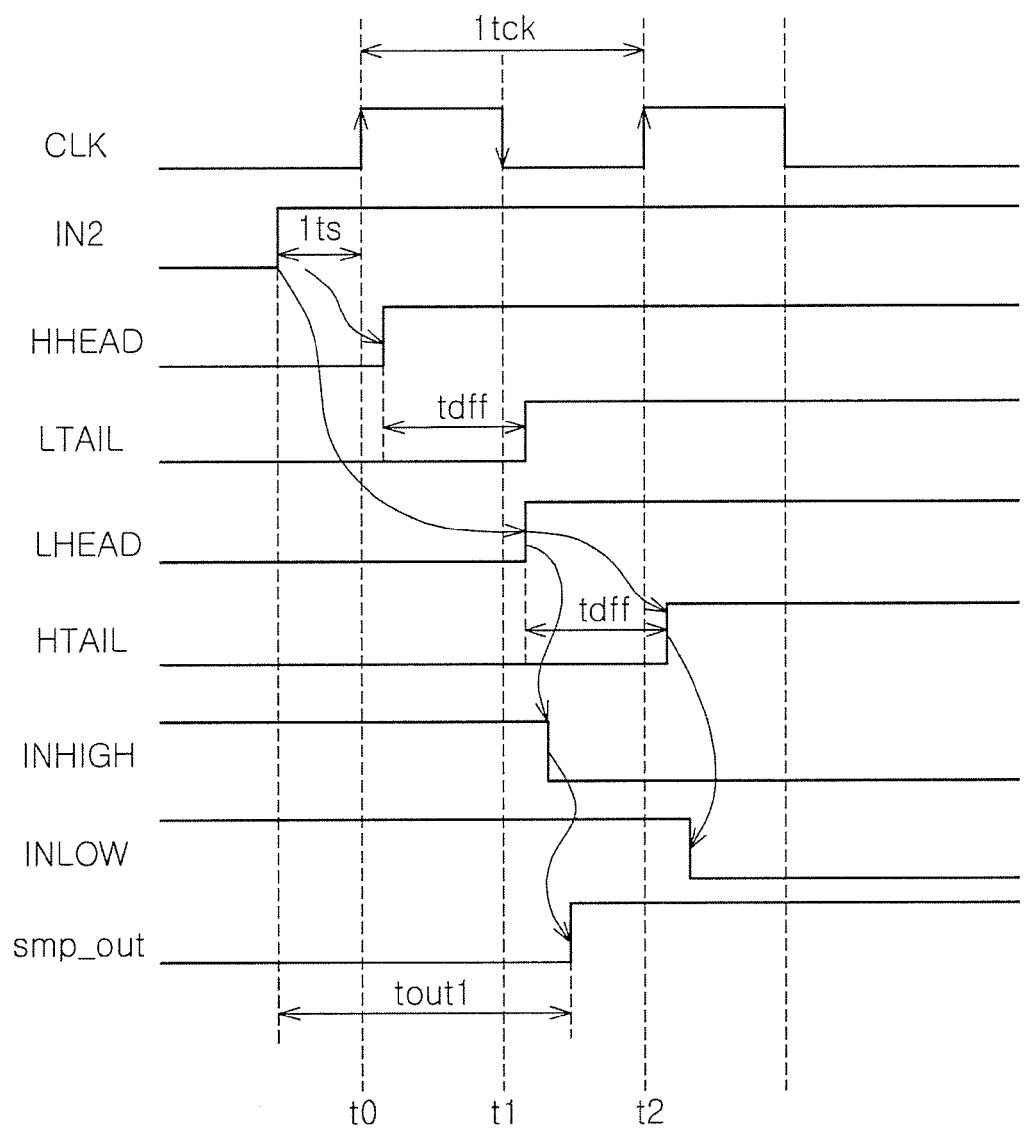
FIGS. 5 and 6 are timing diagrams shown for illustrating output signals of the trigger signal generation block and the combination block shown in FIGS. 3 and 4.
Figure 6:
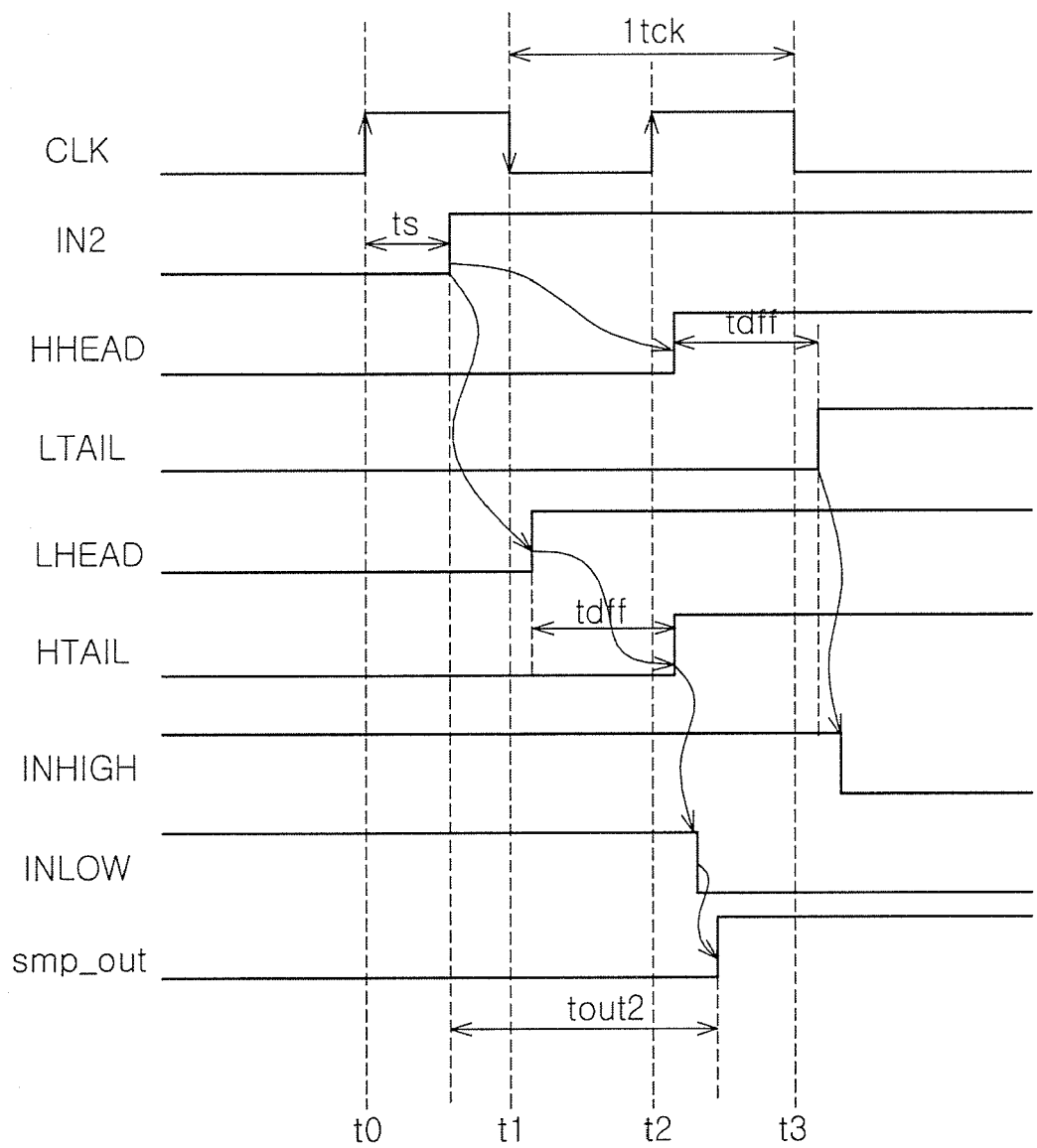

FIGS. 5 and 6 are timing diagrams showing the relation of output signals of the trigger signal generation block 220 and the combination block 240 shown in FIG. 2.

FIG. 5 shows a case where a set-up margin between the internal input signal IN2 and the clock CLK is satisfied, and FIG. 6 shows a case where set-up margin between the internal input signal IN2 and the clock CLK is insufficient.

First, referring to FIG. 5, when a set-up time 'ts' between the internal input signal IN2 and the clock CLK is satisfied, the first trigger signal HHEAD is sampled at a first rising edge of the clock CLK and delayed by a predetermined time to be output. After a delay time tdff between predetermined latch units elapses in response to the first trigger signal HHEAD, the second trigger signal LTAIL is output. The level of the internal input signal IN2 is sampled at the first falling edge of the clock CLK to be provided as the third trigger signal LHEAD. After a delay time tdff between predetermined latch units elapses, the fourth trigger signal HTAIL is also output. The first reference edge signal INLOW (i.e., the NAND combined first and fourth trigger signals HHEAD and HTAIL) is output, and the second reference edge signal INHIGH (the NAND combined second and third trigger signals LHEAD and LTAIL) is also output. Here, it can be appreciated that the second reference edge signal INHIGH precedes the first reference edge signal INLOW. Therefore, the sampling internal signal smp_out is output in response to the preceding signal, that is, the second reference edge signal INHIGH.

That is, when the set-up margin between the internal input signal IN2 and the clock CLK is satisfied, the output timings of the second and third trigger signals LTAIL and LHEAD correspond to each other. Therefore, the sampling internal signal smp_out is output in response to the second reference edge signal INHIGH. It can be appreciated that the timing when the sampling internal signal smp_out is output is within one cycle 1tCK of the clock CLK from the time where the internal input signal IN2 is input.

Referring to FIG. 6, a case where a set-up time between the internal input signal IN2 and the clock CLK is insufficient is illustrated. At the first rising edge t0 of the clock CLK the internal input signal IN2 is sampled having a low level, and at the second rising edge t2 of the clock CLK the internal input signal IN2 is sampled having a high level, thereby outputting the first trigger signal HHEAD. After a delay time tdff between predetermined latch units elapses in response to the first trigger signal HHEAD, the second trigger signal LTAIL is output. The level of the internal input signal IN2 sampled at the first falling edge of the clock CLK is latched on the next falling edge and is output, thereby being output as the third trigger signal LHEAD. After a delay time tdff between predetermined latch units elapses in response to the third trigger signal LHEAD, the fourth trigger signal HTAIL is output. The first reference edge signal INLOW (i.e., the NAND combined first and fourth trigger signals HHEAD and HTAIL) is output, and in the same manner, the second reference edge signal INHIGH (i.e., the NAND combined second and third trigger signals LHEAD and LTAIL) is output. Here, it can be appreciated that the first reference edge signal INLOW precedes the second reference edge signal INHIGH. Therefore, the sampling internal signal smp_out is output in response to the preceding signal, that is, the first reference edge signal INLOW.

When the set-up margin between the internal input signal IN2 and the clock CLK is insufficient as shown in FIG. 6, while the output timings of the second and third trigger signals LHEAD and LTAIL do not correspond to each other, it is shown that the output timings of the first and fourth trigger signals HHEAD and HTAIL do correspond to each other. Therefore, the sampling internal signal smp_out may be output based on the first reference edge signal INLOW generated in response to the first and fourth trigger signals HHEAD and HTAIL. It can be appreciated that the sampling internal signal smp_out is output within one cycle 1tCK of the clock CLK after the internal input signal IN2 is input.

Assuming that the timings between when the sampling internal signal smp_out is output and the time point when the internal input signal IN2 is input, as described above, are a first output time tout1 and a second output time tout2 in FIGS. 5 and 6, respectively. As shown in FIGS. 5 and 6, the first output time tout1 and the second output time tout2 are substantially the same. Therefore, the sampling internal signals smp_out synchronized with one of the rising edge and the falling edge of the clock CLK is provided within 1tCK from the time point when the internal input signal IN2, which is a nonsynchronous signal, is input.

Figure 7:
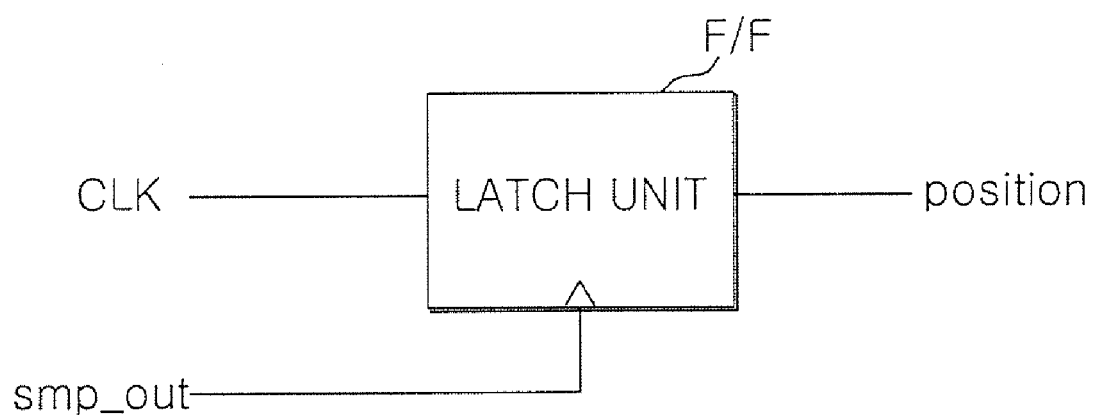
FIG. 7 is a conceptual circuit diagram of a clock edge information block of the sampler shown in FIG. 2.

FIG. 7 is a conceptual circuit diagram showing a clock edge information block 260 shown in FIG. 2.

Referring to FIG. 7, the clock edge information block 260 outputs an edge information signal 'position' in response to the clock CLK and the sampling internal signal smp_out. That is, the clock edge information block 260 provides information for determining whether the timing that the sampling internal signal smp_out is output in response to is the rising edge or the falling edge of the clock CLK.

According to an embodiment of the present invention the clock edge information block 260 may include a latch unit F/F operating in the rising edge of the block 260. Therefore, it can be appreciated that when the signal of the clock CLK latched in the rising edge of the sampling internal signal smp_out is at a low level, (i.e., the edge information signal position is at a low level) the sampling internal signal smp_out is synchronized with the falling edge of the clock CLK. Similarly, it can be appreciated that when the signal of the clock CLK latched in the rising edge of the sampling internal signal smp_out has a high level (i.e., the edge information signal position is at a high level) the sampling internal signal smp_out is synchronized with the rising edge of the clock CLK. As described above, the clock edge information block 260 provides edge information of the clock CLK in synchronization with the sampling internal signal smp_out as a level signal.

Figure 8:
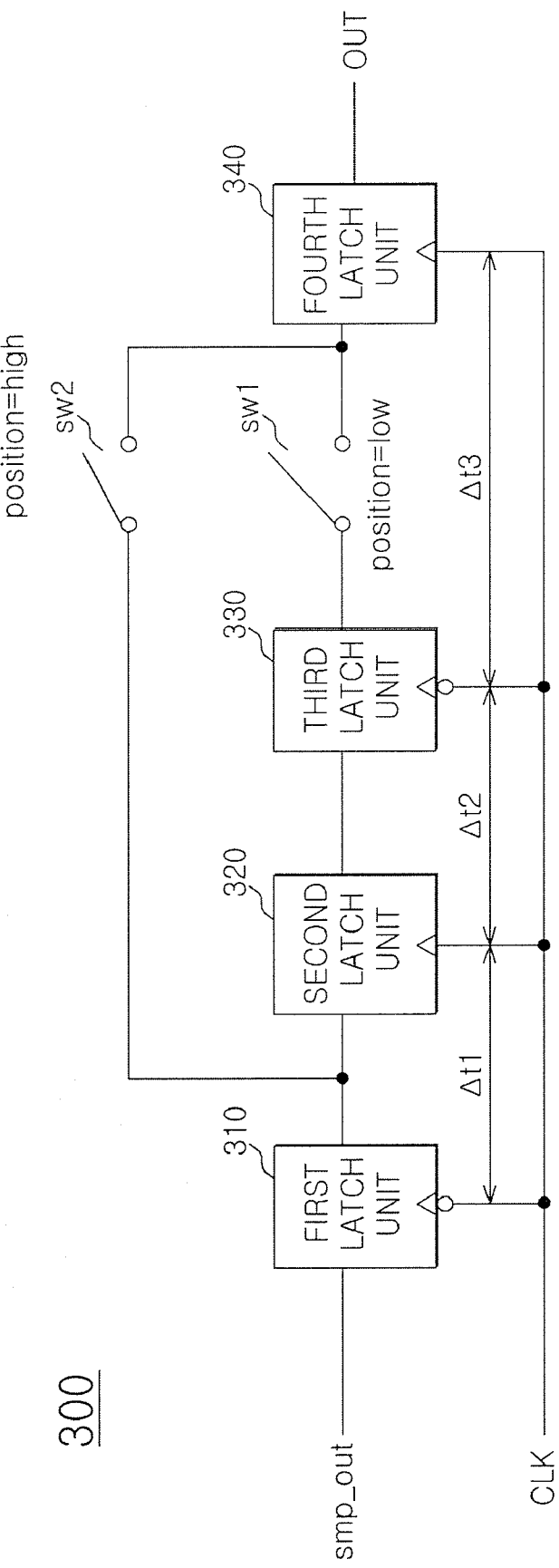
FIG. 8 is a circuit diagram showing an output stage of the domain crossing circuit shown in FIG. 1.

FIG. 8 is a circuit diagram showing an output stage 300 shown in FIG. 1.

Referring to FIG. 8, the output stage 300 is configured to include first to fourth latch units 310 to 340 coupled in series.

The first latch unit 310 receives the sampling internal signal smp_out and operates in response to the falling edge of the clock CLK. The second latch unit 320 receives the output signal from the first latch unit 310 and operates in response to the rising edge of the clock CLK. The third latch unit 330 receives the output signal from the second latch unit 320 and operates in response to the falling edge of the clock CLK. The fourth latch unit 340 receives the output signal from one of the third latch unit 330 and the first latch unit 310 and operates in response to the rising edge of the clock CLK.

When the edge information signal position is at a low level, a first switch is activated such that the sampling internal signal smp_out is passed through the first to fourth latch units 310 to 340. However, when the edge information signal position has a high level, a second switch is activated such that the sampling internal signal smp_out is passed through only the first and fourth latch units 310 and 340. Here, although the first and second switches sw1 and sw2 are described for convenience of explanation, the present invention is not limited herein, for example a transmission gate may be used in the realization of the output stage 300. Therefore, according to an embodiment of the present invention, the circuit unit can be implemented so that the number of latch units driven depends on the level of the edge information signal position. That is, the number of latch units driven is selectively varied depending on the level of the edge information signal position.

If a delay time between the first and second latch units 310 and 320 is Δt1, a delay time between the second and third latch units 320 and 330 is Δt2, and a delay time between the third and fourth latch units 330 and 340 is Δt3, the delay time between latch units is set as constant ½tCK, as will be described below.

A final output signal OUT, to be used in the internal circuit, can avoid colliding with the operation or the timing spec of other internal circuit units only when the final output signal OUT is output in synchronization with the rising edge of the clock CLK.

Therefore, when the sampling internal signal smp_out is synchronized with the rising edge of the clock CLK, the output stage 300 selects a portion of the latch units so that the final output signal OUT is output in response to the rising edge of the clock CLK within a predetermined time, that is, within a time of 1tCK, so as to be synchronized with the rising edge of the clock CLK in response to the high-level edge information signal position.

Similarly, when the sampling internal signal smp_out is output in response to the falling edge of the clock CLK, it all of the latch units in the output stage 300 are utilized so as to additionally delay a predetermined time. Therefore, according to the present invention, even when the sampling internal signal smp_out is output in response to the falling edge of the clock CLK, the final output signal OUT can be output in response to the rising edge of the clock CLK.

Therefore, when the edge information signal position is at a low level, the sampling internal signal smp_out is received and passed through all of the first to fourth latch units 310 to 340, thereby providing the final output signal OUT. Similarly, when the edge information signal position is at a high level, the sampling internal signal smp_out is received and passed through partial latch units, that is for example, the first and fourth latch units 310 and 340, thereby providing the final output signal OUT.

Figure 9:
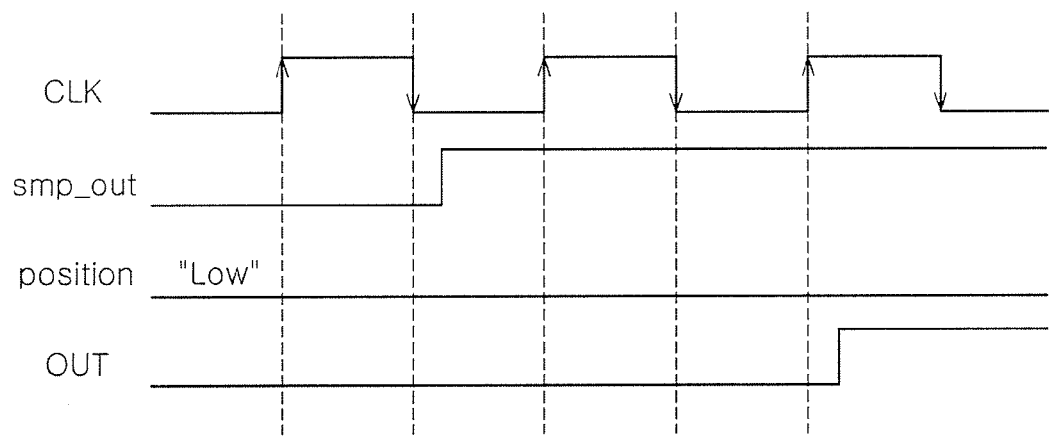
FIGS. 9 and 10 are timing diagrams shown for illustrating output signals of the output stage shown in FIG. 8.
Figure 10:
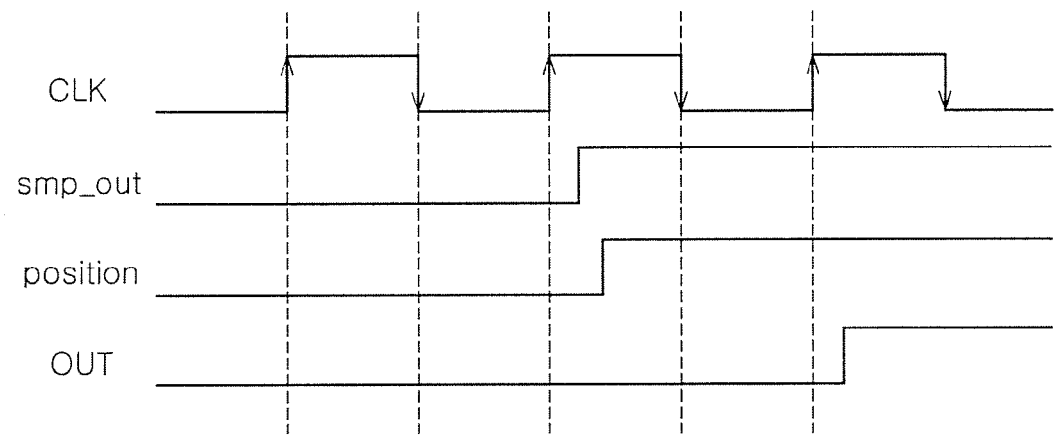

FIGS. 9 and 10 are timing diagrams shown for illustrating the operation of the clock CLK, the sampling internal signal smp_out, and the final output signal OUT.

Referring to FIGS. 8 to 10, the synchronization of the final output signal OUT with the rising edge of the clock CLK using the edge information signal position is described below.

First, FIG. 9 shows a case where the sampling internal signal smp_out is output in response to the falling edge of the clock CLK while the edge information signal position is at a low level. Therefore, for the sampling internal signal smp_out to be synchronized with the rising edge of the clock CLK, the total delay time includes the time of 1tCK and additionally the time of ½tCK, such that the sampling internal signal smp_out passes through all of the first to fourth latch units 310 to 340. In other words, in a case where the sampling internal signal smp_out is output in response to a falling edge of the clock CLK, the output of the sampling internal signal smp_out is delayed by the difference ½tCK between the falling edge and the rising edge of the clock CLK and is output to be synchronized with the rising edge of the clock CLK in addition to a stabilized predetermined time (time of one clock cycle 1tCK) from the application of the sampling internal signal smp_out to the final output, thereby making it possible to provide the final output signal OUT.

FIG. 10 shows a case where the sampling internal signal smp_out is output in response to the rising edge of the clock CLK while the edge information signal position has a high level. Therefore, for the sampling internal signal smp_out to be synchronized with the rising edge of the clock CLK, the sampling internal signal smp_out passes through the first and fourth latch units 310 and 340, since the sampling internal signal smp_out can be synchronized with the rising edge of the clock CLK when the sampling internal signal smp_out is output within one stable clock cycle 1tCK from a time when the sampling internal signal smp_out is applied. Thereby, the final output signal OUT can be provided in response to the rising edge of the clock CLK.

This is only an example to synchronously adjust the delay time to be responded to the rising edge of the clock CLK in response to the sampling internal signal smp_out. It is to be understood that it is also possible to configure the sampling internal signal smp_out output in response to the falling edge of the clock CLK depending on the constitution of the internal circuit or the property of the signal.

As described above, the domain crossing circuit according to an embodiment of the present invention samples and uses the transition information of the clock CLK, making it possible to synchronize a nonsynchronous signal with the clock and to synchronize the nonsynchronous signal again with the desired edge of the clock using the clock edge information at the synchronized time point.

While certain embodiments have been described herein, it will be understood that the embodiments described are by way of example only. Accordingly, the device and method described herein should not be limited based on the described embodiments. Rather, the devices and methods described herein should only be limited in light of the claims that follow when taken in conjunction with the above description and accompanying drawings.

What is claimed is:

1. A domain crossing circuit of a semiconductor memory apparatus, comprising:
   a sampler providing a sampling internal signal generated by sampling an internal signal using a falling edge of a clock and a rising edge of the clock and providing an edge information signal defining whether an output timing of the sampling internal signal is in logic "low" or logic "high" of the clock; and
   an output stage synchronizing the sampling internal signal with the clock in response to the edge information signal and outputting the synchronized sampling internal signal as a final output signal,
   wherein the sampler outputs the sampling internal signal and the edge information signal to the output stage, and the output stage receives the sampling internal signal and the edge information signal.

2. The domain crossing circuit of the semiconductor memory apparatus of claim 1, wherein the sampler is configured to comprise:

a trigger signal generation block sampling the internal input signal using the falling edge of the clock and the rising edge of the clock and so as to provide a plurality of trigger signals;

a combination block that provides the sampling internal signal by using a combination of the plurality of trigger signals; and a clock edge information block that receives the sampling internal signal and provides edge information of the clock that is an output reference of the sampling internal signal as the edge information signal.

3. The domain crossing circuit of the semiconductor memory apparatus of claim 2, wherein the trigger generation block is configured to include a plurality of latch units providing the plurality of trigger signals, the plurality of latch units configured to comprise:

a first latch unit sampling the internal input signal at a rising edge of the clock after a time point when the internal input signal is input;

a second latch unit sampling an output signal of the first latch unit at a falling edge of the clock;

a third latch unit that sampling internal input signal at a falling edge of the clock after a time point when the internal input signal is input; and a fourth latch unit sampling an output signal from the third latch unit at a rising edge of the clock.

4. The domain crossing circuit of the semiconductor memory apparatus of claim 3, wherein a delay time between latch units coupled in series is set as a half cycle of the clock.

5. The domain crossing circuit of the semiconductor memory apparatus of claim 3, wherein when a set-up time between the internal input signal and the clock is satisfied, output timings of the second and third latch units correspond to each other, and when the set-up time between the internal input signal and the clock is not satisfied, output timings of the first and fourth latch units correspond to each other.

6. The domain crossing circuit of the semiconductor memory apparatus of claim 3, wherein the combination block provides a first reference edge signal by combining output signals from the first and fourth latch units, and provides a second reference edge signal by combining output signals from the second and third latch units.

7. The domain crossing circuit of the semiconductor memory apparatus of claim 6, wherein based on the falling edge of the clock after the internal input signal is applied, when the levels of the output signals from the second and third latch units are the same the combination block provides the sampling internal signal in response to the second reference edge signal, and when the levels of the output signals from the second and third latch units are not the same the combination block provides the sampling internal signal in response to the first reference edge signal.

8. The domain crossing circuit of the semiconductor memory apparatus of claim 2, wherein the clock edge information block detects a level of the clock in response to a rising edge of the sampling internal signal.

9. The domain crossing circuit of the semiconductor memory apparatus of claim 8, wherein the clock edge information block provides the edge information signal to determine whether the timing when the sampling internal signal is output is responded to the rising edge of the clock or to the falling edge of the clock using the detected level of the clock.

10. The domain crossing circuit of the semiconductor memory apparatus of claim 1, wherein when the edge information signal has a first level, the output stage delays the sampling internal signal by a first predetermined time to provide the sampling internal signal as a final output signal, and when the edge information signal has a second level, the output stage delays the sampling internal signal by a second predetermined time to provide the sampling internal signal as the final output signal, wherein the first and second predetermined times are different from each other.

11. A domain crossing circuit of a semiconductor memory apparatus, comprising:

a sampler providing a sampling internal signal generated by synchronizing an internal input signal with a falling edge of a clock and a rising edge of the clock, and providing an edge information signal that defines whether an output timing of the sampling internal signal is in logic "low" or logic "high" of the clock, wherein the internal input signal is a non-synchronous signal; and an output stage in which a final output signal is synchronized with the clock by delaying the sampling internal signal at a different delay time according to levels of the edge information signal, wherein the sampling internal signal is selectively synchronized with one of a rising edge and a falling edge of the clock and the final output signal is synchronized with the rising edge of the clock, wherein the sampler outputs the sampling internal signal and the edge information signal to the output stage, and the output stage receives the sampling internal signal and the edge information signal.

12. The domain crossing circuit of the semiconductor memory apparatus of claim 11, wherein the sampler is configured to comprise:

a trigger signal generation block sampling the internal input signal using the falling edge and the rising edge of the clock to provide a plurality of trigger signals;

a combination block that provides the sampling internal signal by using a combination of the plurality of trigger signals; and a clock edge information block that receives the sampling internal signal and provides edge information of the clock that is an output reference of the sampling internal signal as the edge information signal.

13. The domain crossing circuit of the semiconductor memory apparatus of claim 12, wherein the trigger generation block is configured to include a plurality of latch units providing the plurality of trigger signals, the plurality of latch units configured to comprise:

a first latch unit sampling the internal input signal at a rising edge of the clock after a time point when the internal input signal is input;

a second latch unit sampling an output signal of the first latch unit at a falling edge of the clock;

a third latch unit sampling the internal input signal at a falling edge of the clock after a time point when the internal input signal is input; and a fourth latch unit that samples an output signal from the third latch unit at a rising edge of the clock.

14. The domain crossing circuit of the semiconductor memory apparatus of claim 13, wherein a delay time between latch units coupled in series is set as a half cycle of the clock.

15. The domain crossing circuit of the semiconductor memory apparatus of claim 13, wherein when a set-up time between the internal input signal and the clock is satisfied, output timings of the second and third latch units correspond to each other, and when the set-up time between the internal input signal and the clock is not satisfied, output timings of the first and fourth latch units correspond to each other.

16. The domain crossing circuit of the semiconductor memory apparatus of claim 13, wherein the combination block provides a first reference edge signal by combining output signals from the first and fourth latch units, and provides a second reference edge signal by combining output signals from the second and third latch units.

17. The domain crossing circuit of the semiconductor memory apparatus of claim 16, wherein based on the falling edge of the clock after the internal input signal is applied, when the levels of the output signals from the second and third latch units are the same the combination block provides the sampling internal signal in response to the second reference edge signal, and when the levels of the output signals from the second and third latch units are not the same the combination block provides the sampling internal signal in response to the first reference edge signal.

18. The domain crossing circuit of the semiconductor memory apparatus of claim 12, wherein the clock edge information block detects a level of the clock in response to a rising edge of the sampling internal signal.

19. The domain crossing circuit of the semiconductor memory apparatus of claim 18, wherein the clock edge information block provides the edge information signal to determine whether the timing when the sampling internal signal is output is responded to the rising edge of the clock or to the falling edge of the clock using the detected level of the clock.

20. The domain crossing circuit of the semiconductor memory apparatus of claim 11, wherein when the edge information signal has a first level, the output stage delays the sampling internal signal by a first predetermined time to provide the sampling internal signal as a final output signal, and when the edge information signal has a second level, the output stage delays the sampling internal signal by a second predetermined time to provide the sampling internal signal as the final output signal, wherein the first and second predetermined times are different from each other.

21. The domain crossing circuit of the semiconductor memory apparatus of claim 20, wherein when the sampling internal signal is output in synchronization with the rising edge of the clock, the output stage is output after the first predetermined time, and when the sampling internal signal is output in synchronization with the falling edge of the clock, the output stage is output after the second predetermined time, such that the final output signal is output at the rising edge of the clock.

* * * * *